United States Patent
Peng

(10) Patent No.: US 6,524,431 B1
(45) Date of Patent: Feb. 25, 2003

(54) APPARATUS FOR AUTOMATICALLY CLEANING MASK

(75) Inventor: Kuang-Chung Peng, Taipei (TW)

(73) Assignee: Helix Technology Inc., Hsinchu (TW)

( * ) Notice: Subject to any disclaimer, the term of this patent is extended or adjusted under 35 U.S.C. 154(b) by 125 days.

(21) Appl. No.: 09/710,710

(22) Filed: Nov. 10, 2000

(51) Int. Cl.[7] ............................................. C23C 14/00
(52) U.S. Cl. ........................ 156/345.43; 156/345.55; 118/723 VE; 204/298.05; 204/298.41; 134/1; 134/21
(58) Field of Search ..................... 156/345.43, 345.55; 118/723 VE; 204/298.05, 298.41; 134/1, 21

(56) References Cited

U.S. PATENT DOCUMENTS

| | | | |
|---|---|---|---|
| 4,420,386 A | * 12/1983 | White | 204/298.05 |
| 4,516,525 A | * 5/1985 | Bourgeois et al. | 118/688 |
| 5,916,712 A | * 6/1999 | Miyashita et al. | 430/5 |

* cited by examiner

Primary Examiner—Thi Dang
(74) Attorney, Agent, or Firm—J.C. Patents

(57) ABSTRACT

An apparatus for automatically cleaning a mask applied to a mask cleaning step after an evaporation process. An RF plasma is used to clean the mask. By isolating the RF plasma generator, the wafer table and the mask table from the grounded reaction chamber, the RF voltage is supplied to the wafer table and the mask table. The bias generated by the RF voltage during evaporation process can thus be reduced to enhance the efficiency of evaporation. After removing the wafer being performed with the evaporation process, the RF plasma can be used to clean the mask. The mask can thus be fixed on the mask table without being removed or renewing the mask table.

3 Claims, 3 Drawing Sheets

APPARATUS FOR AUTOMATICALLY CLEANING MASK

BACKGROUND OF THE INVENTION

1. Field of the Invention

The invention relates in general to an apparatus for automatically cleaning a mask. More particularly, this invention relates to apparatus for automatically cleaning a mask applied in an evaporation system.

2. Description of the Related Art

An evaporation system typically comprises a vacuum chamber for executing vacuum evaporation and a vacuum system to provide vacuum of the vacuum chamber. In the vacuum chamber, an evaporation source is disposed in a crucible made of high temperature conductive material. The crucible is connected with an external DC current source. When an appropriate amount of current flows to the crucible, the evaporation source is heated caused by the resistor of the crucible until reaching the melting point. The atoms evaporated from the evaporation source are then deposited as a thin film on the wafer which is disposed close by.

FIG. 1 shows a top view of an evaporation system. In FIG. 1, the evaporation system comprises a vacuum chamber 100 and a vacuum system 101. The vacuum system 101 is connected and external to the vacuum chamber 100. The vacuum chamber 100 comprises a crucible 102 and a mask positioning apparatus. The crucible 102 is located at a lower part inside the vacuum chamber 100 to carry the evaporation source 103. The mask positioning apparatus located at an upper part inside the vacuum chamber 100 comprises a wafer table 104 and a mask table 105. The wafer table 104 carries a wafer 106 for performing the thin film deposition. The mask table 105 carries a mask 107 to obtain a desired pattern of the deposition. The mask 107 is made of magnetic material. A magnet 108 is disposed on top of the vacuum chamber 100 to attract the mask 107 which can thus be adhered on the surface of the wafer 106. When an appropriate amount of current flowing to the crucible 102, the heat generated by resistance effect of the crucible 102 heat the evaporation source up to a melting point. The previously solid evaporation source 103 is thus evaporated to deposit a thin film on the wafer 106.

In the above conventional apparatus, as the step coverage of the thin film deposition is poor, hillocks are very likely formed on the wafer. After performing several times of evaporation processes, the mask to transfer the pattern on the wafer has been adhered with a lot of particles of evaporation source. The particles of evaporation source adhered on top surface or sidewall of the mask seriously affects the transferred pattern. Therefore, conventionally, the mask is a consumable part. After performing certain times of evaporation processes, the mask has to be renewed to maintain the quality of the transferred pattern. This greatly raises the fabrication cost and consumes a lot of process time and space for storing the masks.

SUMMARY OF THE INVENTION

The invention provides an apparatus for automatically cleaning a mask. The mask is fixed on the mask table and cleaned by an RF plasma in a vacuum chamber. Using the RF bias, the efficiency for evaporating the wafer can be enhanced.

The apparatus comprises an RF plasma generator, a wafer table and a mask table. Isolated from the grounded reaction chamber. The RF power source can thus be supplied to the wafer table and the mask table. During the evaporation process, an RF power is provided to cause a voltage drop of the bias, so that the mobility of the evaporation source toward the wafer is enhanced, so that the efficiency of evaporation is enhanced. After evaporation, the wafer is removed from the reaction chamber. The RF power source generates an RF plasma to bombard the mask, so that the particles of the evaporation source attached on the top surface and sidewall of the mask are removed. The mask can thus be kept on the mask table without being removed. As a result, the cost and time consumption can be saved.

Both the foregoing general description and the following detailed description are exemplary and explanatory only and are not restrictive of the invention, as claimed.

DESCRIPTION OF THE PREFERRED EMBODIMENTS

Figure 1:
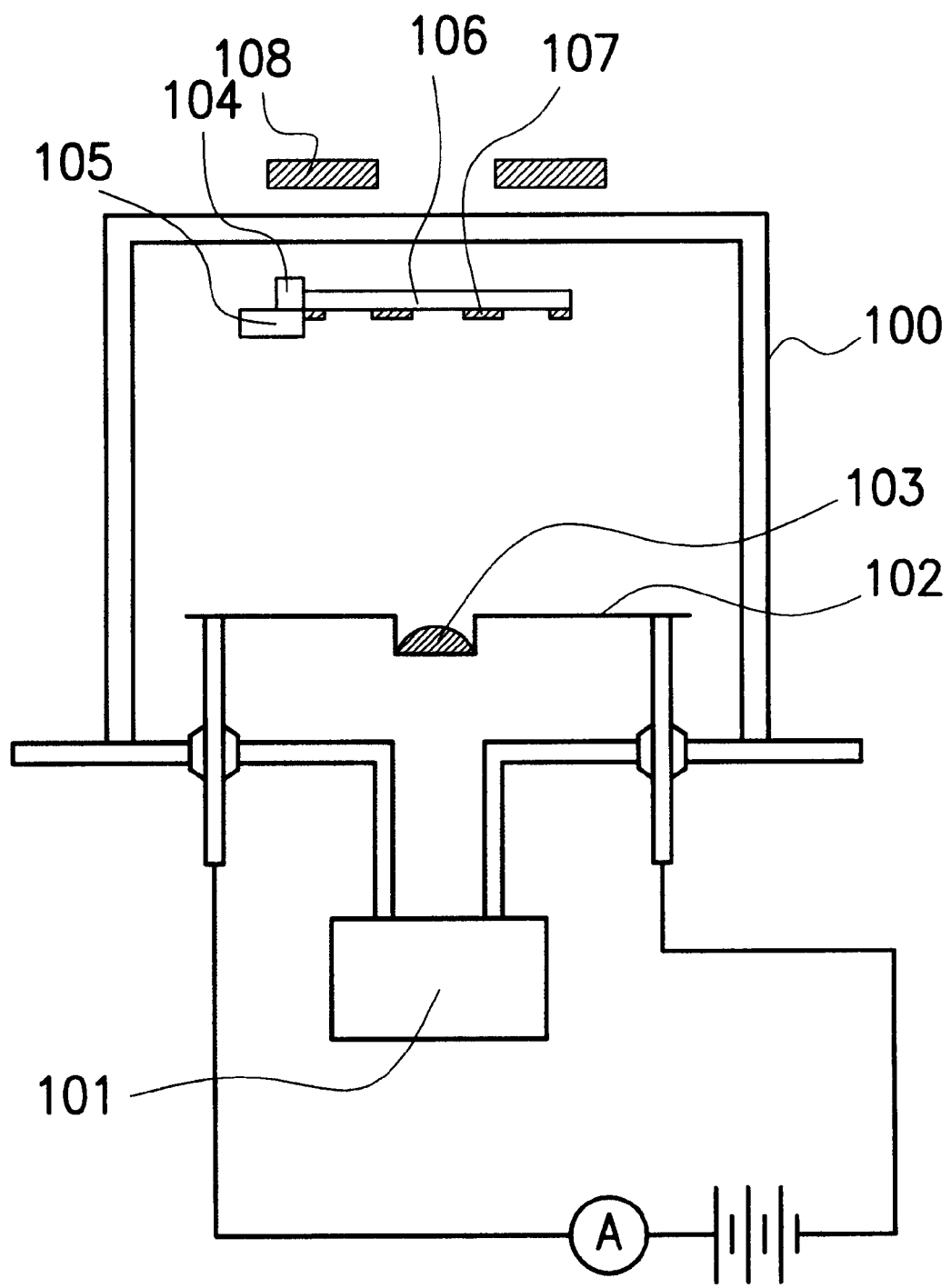
FIG. 1 shows a conventional evaporation system.
Figure 2A:
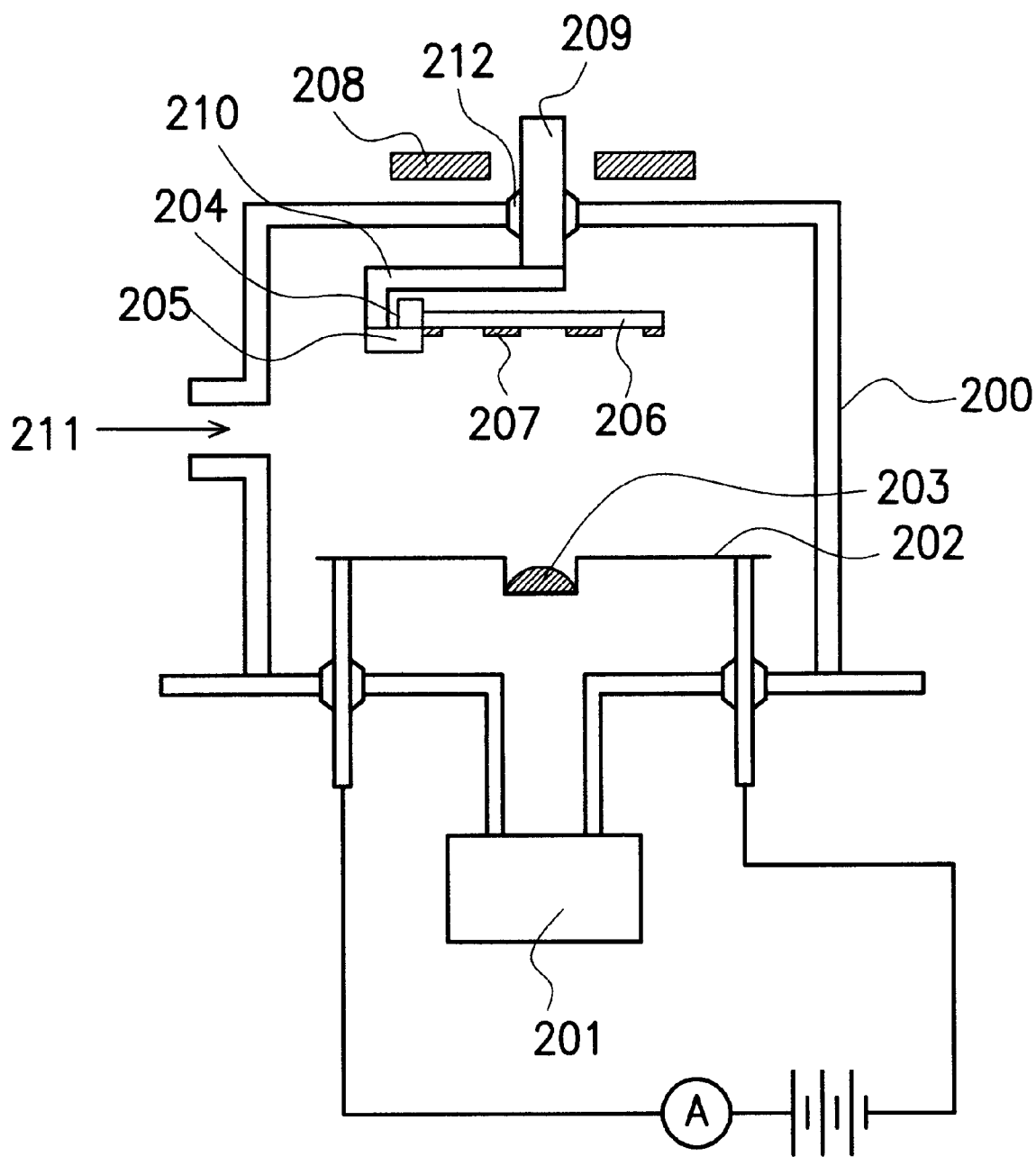
FIGS. 2A and 2B are cross sectional views of a evaporation system provided by the invention.

In FIG. 2A, the evaporation system comprises a vacuum chamber 200, a vacuum system 211 and an RF power supply 209, for example, an AC current supplier. The vacuum system 211 is connected to the vacuum chamber 200 externally to maintain the vacuum in the vacuum chamber. The RF power supply 209 is connected to the vacuum chamber 200 via an insulator 212 on a top surface of the vacuum chamber 200, and the bottom portion of the RF power supply 206 is connected to a rotating table 210. In this manner, the vacuum chamber 200 is insulated from the RF power supply 209. An gas inlet 211 is located on a sidewall of the vacuum chamber 200 to provide the reaction gas required by the RD power supply 209. A crucible 202 is located at a bottom portion inside of the vacuum chamber 200 to carry an evaporation source 203. Inside the vacuum chamber 200, a wafer table 204 and a mask table 205 are disposed at an upper portion. The mask table 205 is connected to the rotating table 210, and a wafer 206 is disposed on the wafer table 206 to perform evaporation. Meanwhile, a mask 207 is floated on the wafer 206 to obtain required pattern. The mask 207 is made of magnetic material such as iron containing material. A magnet 208 is disposed on top of the vacuum chamber 200 to attract the mask 207.

When a certain amount of current flowing through the crucible 202, via the heat produced by resistance effect of the crucible 202, the evaporation source 203 is heated up to a temperature near the melting point of the evaporation source 203. The previous solid evaporation source 203 is then evaporated to deposit a thin film on the wafer 206. Meanwhile, the RF power supply 209 supplies a voltage to provided a bias that drives the particles of the evaporated evaporation source 203 to move towards the wafer 206. The operation frequency of the RF voltage is about 13.56 MHz, for example, and the vacuum in the vacuum chamber 200 is maintained. After several times of the evaporation processes, particles of the evaporation source are attached on the surface of sidewall of the mask 207 to affect the transferred pattern in the next evaporation process.

Figure 2B:
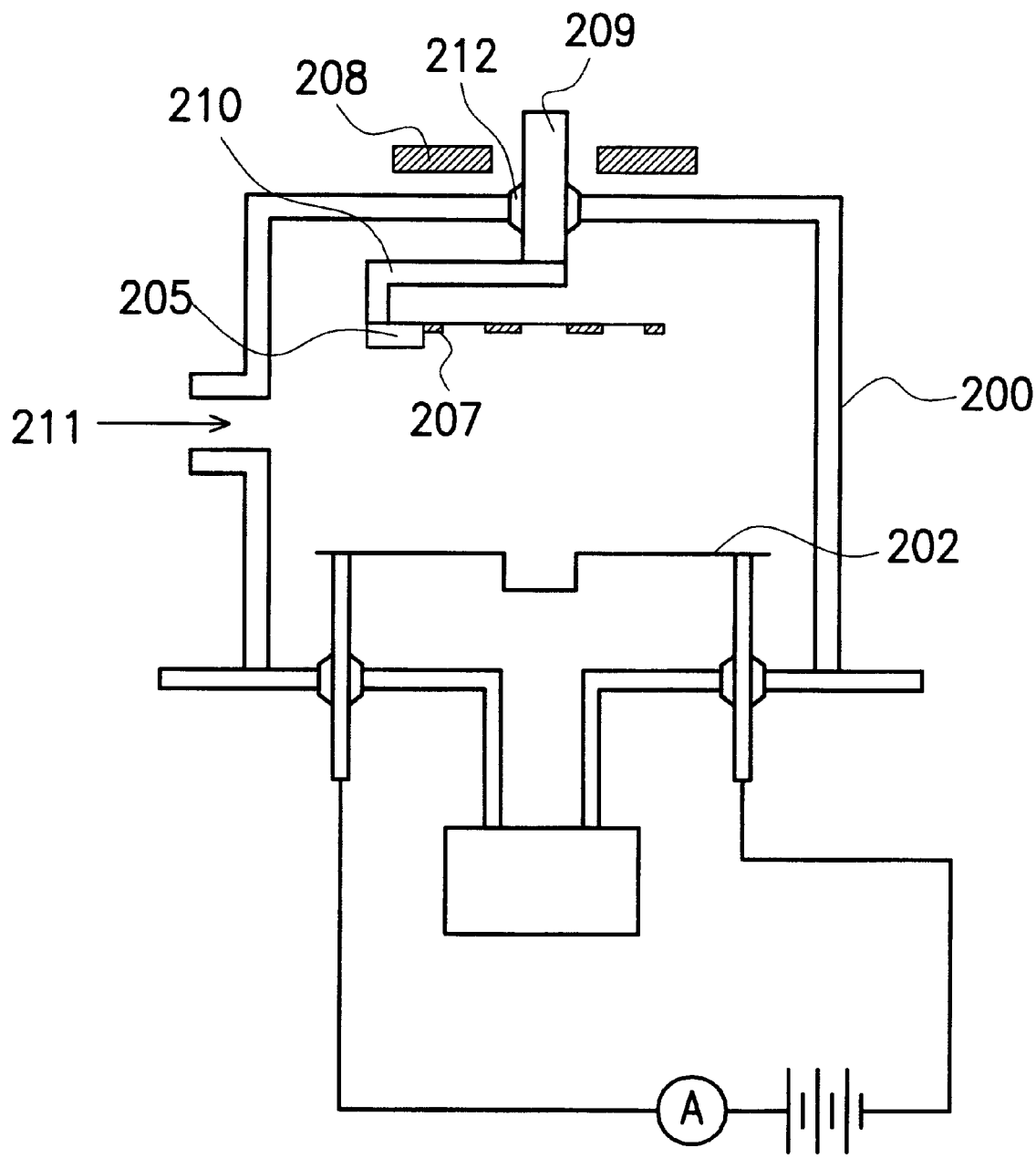

In FIG. 2B, after evaporation, the wafer 206 and the wafer table 206 are removed from the vacuum chamber 200. A mask cleaning step is performed. A RF plasma generator is activated. That is, an RF voltage is supplied by the RF power supply 209 with an operation frequency of about 13.56

MHz, and a reaction gas, for example, the argon gas, is provided from the gas inlet 211. The vacuum status in the vacuum chamber 200 is maintained. Being driven by the RF voltage, the reaction gas is then deionized into ions to move towards the mask 207. The mask 207 is then bombarded and cleaned by the ions, so that the particles of the evaporation source attached on the surface and sidewall of the mask 207 are removed. The mask 207 can thus be fixed and kept on the mask table 205 without being removed or renewed.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. An apparatus for automatically cleaning a mask in an evaporation system, the apparatus comprises:

a vacuum chamber, connected with an external vacuum system, the vacuum chamber comprising a crucible at a bottom portion therein;

an RF power supplier, connected to a rotating table at an upper portion inside the vacuum chamber, the RF power supplier being insulated from the vacuum chamber;

a mask positioning apparatus, insulated from the vacuum chamber and further comprising a mask table and a wafer table, the mask table being connected to the rotating table;

a gas inlet, on a sidewall of the vacuum chamber; and at least a magnet, located on top of the vacuum chamber to attract the mask carried by the mask table to be floated on a wafer carried by the wafer table.

2. The apparatus according to claim 1, wherein an evaporation source is carried within the crucible.

3. The apparatus according to claim 1, wherein the RF power supply comprises an AC current supply.

* * * * *